(12) United States Patent
Endo et al.

(10) Patent No.: US 7,106,085 B2
(45) Date of Patent: Sep. 12, 2006

(54) ELECTRONIC CIRCUIT UNIT HAVING SMALL SIZE AND GOOD PRODUCTIVITY

(75) Inventors: Masaaki Endo, Fukushima-ken (JP); Toshiro Furuta, Fukushima-ken (JP); Wataru Saitoh, Miyagi-ken (JP); Tadaomi Yamano, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/932,953

(22) Filed: Sep. 2, 2004

(65) Prior Publication Data

US 2005/0052198 A1 Mar. 10, 2005

(30) Foreign Application Priority Data

Sep. 5, 2003 (JP) .............................. 2003-313910

(51) Int. Cl.
*G01R 31/26* (2006.01)
*G01R 31/28* (2006.01)

(52) U.S. Cl. .................................... 324/765; 324/158.1
(58) Field of Classification Search ..................... None
See application file for complete search history.

(56) References Cited

U.S. PATENT DOCUMENTS

| | | | | |
|---|---|---|---|---|
| 4,995,263 | A * | 2/1991 | Stocker | 73/702 |
| 6,748,807 | B1 * | 6/2004 | Yoshiuchi et al. | 73/493 |
| 6,754,950 | B1 * | 6/2004 | Furukawa et al. | 29/832 |
| 6,774,641 | B1 * | 8/2004 | Sasaki et al. | 324/627 |
| 6,846,998 | B1 * | 1/2005 | Hasumi et al. | 368/321 |
| 2001/0015890 | A1 * | 8/2001 | Funahara et al. | 361/761 |

FOREIGN PATENT DOCUMENTS

| JP | 08222827 | A * | 8/1996 |
|---|---|---|---|
| JP | 2000100982 | A * | 4/2000 |
| JP | 2000165086 | A * | 6/2000 |
| JP | 2002-009469 | | 11/2002 |
| JP | 2003218259 | A * | 7/2003 |
| JP | 2004088088 | A * | 3/2004 |
| JP | 2004312285 | A * | 11/2004 |
| JP | 2005235806 | A * | 9/2005 |

* cited by examiner

*Primary Examiner*—Jermele Hollington
(74) *Attorney, Agent, or Firm*—Brinks Hofer Gilson & Lione

(57) ABSTRACT

An electronic circuit unit includes a circuit board mounted within a frame member, an electronic component with a cover mounted on the circuit board, and linear terminals passing through and being mounted in the circuit board. The terminals include first and second terminal groups arranged at an interval between the respective terminals in a line. The terminal groups are arranged in a line in the vicinity of one side of the circuit board. An opening portion is provided between the first and second terminal groups, and the electronic component with the cover is mounted on the circuit board while being disposed in the opening portion. As a result, a space factor for the arrangement of the electronic component with the cover is very good, and thus it is possible to reduce a widthwise dimension of the circuit board.

6 Claims, 3 Drawing Sheets

ELECTRONIC CIRCUIT UNIT HAVING SMALL SIZE AND GOOD PRODUCTIVITY

This application claims the benefit of priority to Japanese Patent Application No. 2003-313910 filed Sep. 5, 2003, herein incorporated by reference.

BACKGROUND OF THE INVENTION

1. Field of the Invention

The present invention relates to an electronic circuit unit suitable for a television tuner and the like.

2. Description of the Related Art

FIG. 7 is an exploded perspective view of a conventional electronic circuit unit.

Next, the construction of the conventional electronic circuit unit will be described with reference to FIG. 7. A box-shaped (a square shape) frame member 51 composed of a metal plate has opened portions 51a and 51b provided in two of its sides, tongue pieces 51c respectively provided in four sides of the square shape, and a plurality of mounting legs 51d projecting downward from the vicinities of four corners.

A shield plate 52 composed of a metal plate is arranged within the frame member 51 to divide the inside of the frame member 51 into a plurality of divided rooms.

A circuit board 53 composed of an insulating substrate has a plurality of notched portions 53a provided in its outer circumferential edge, and a conductive pattern (not shown) for wiring lines is provided on front and rear surfaces of the circuit board. On the circuit board 53, an electronic component 54 with a cover or an electronic component 55, such as a coil, is mounted, thereby forming a desired electric circuit.

A plurality of linear terminals 56 is arranged to pass through the circuit board 53 in the vicinity of one side of the circuit board 53 and is mounted in the conductive pattern by means of solder.

The plurality of terminals 56 is arranged at equal intervals in a line. As regards the respective terminals, a portion projecting downward from the circuit board 53 is a terminal portion 56a, and a portion projecting upward from the circuit board 53 is a retaining portion 56b.

Further, the circuit board 53 is housed in the frame member 51, and the tongue pieces 51c are bent toward the notched portions 53a. In addition, the conductive pattern and the tongue pieces 51c are soldered, whereby the circuit board 53 is mounted in the frame member 51.

A first cover (an upper cover) 57 and a second cover (a lower cover) 58 composed of a metal plate are respectively mounted in the frame member 51 so as to cover the opened portions 51a and 51b of the frame member 51.

At this time, the terminal portions 56a of the respective terminals 56 project downward from holes 58a of the second cover 58. (For example, see Japanese Unexamined Patent Application Publication No. 2002-9469)

In the conventional electronic circuit unit having the above-mentioned construction, the plurality of terminals 56 is arranged in a line, and the electronic component with the cover 54 is arranged out of line. Therefore, the size of the circuit board 53 increases in a widthwise direction.

Further, since the plurality of terminals 56 is mounted separately, the manufacturing workability is generally decreased.

In the conventional electronic circuit unit, since the plurality of terminals 56 is arranged in a line, and the electronic component 54 is arranged out of line, there is a problem in that the size of the circuit board 53 increases in a widthwise direction to be large-sized.

Further, since the plurality of terminals 56 is mounted separately, there is a problem in that the workability and productivity are often decreased.

SUMMARY OF THE INVENTION

Thus, it is an object of the present invention to provide an electronic circuit unit having a small size and good productivity.

In order to achieve the object, according to a first aspect of the present invention, there is provided an electronic circuit unit comprising: a box-shaped frame member composed of a metal plate; a circuit board mounted in the frame member; an electronic component with a cover mounted on the circuit board; and a plurality of linear terminals mounted in the circuit board while passing through the circuit board, wherein the terminals comprise at least a first terminal group and a second terminal group arranged at an interval between the respective terminals in a line, the first terminal group and the second terminal group being arranged in the vicinity of one side of the circuit board, wherein an opening portion is provided between the first terminal group and the second terminal group, and wherein the electronic component with the cover is mounted on the circuit board while being disposed in the opening portion.

According to a second aspect of the present invention, the electronic component comprises a quartz oscillator.

Further, according to a third aspect of the present invention, the electronic circuit unit further comprises supporting members made of an insulating material, wherein one end of each of the terminals is supported by the supporting member, and the supporting members and the electronic component with the cover are arranged on the same surface of the circuit board.

Furthermore, according to a fourth aspect of the present invention, the supporting members are integrally formed with the first terminal group and the second terminal group, respectively.

Moreover, according to a fifth aspect of the present invention, the inside of the frame member is divided into a plurality of divided rooms by means of a shield plate, wherein a tuner circuit portion for frequency-converting received television signals into intermediate frequency signals and a demodulation circuit portion for detecting the intermediate frequency signals and for outputting video signals and audio signals are respectively arranged in the divided rooms adjacent to each other with the shield plate interposed therebetween, and wherein a phase locked loop (PLL) IC provided in the tuner circuit portion and a demodulation IC provided in the demodulation circuit portion are connected to the quartz oscillator.

Further, according to a sixth aspect of the present invention, the quartz oscillator is housed in the divided room disposed at the side of the tuner circuit portion adjacent to the shield plate provided between the tuner circuit portion and the demodulation circuit portion.

DESCRIPTION OF THE PREFERRED EMBODIMENTS

Figure 1:
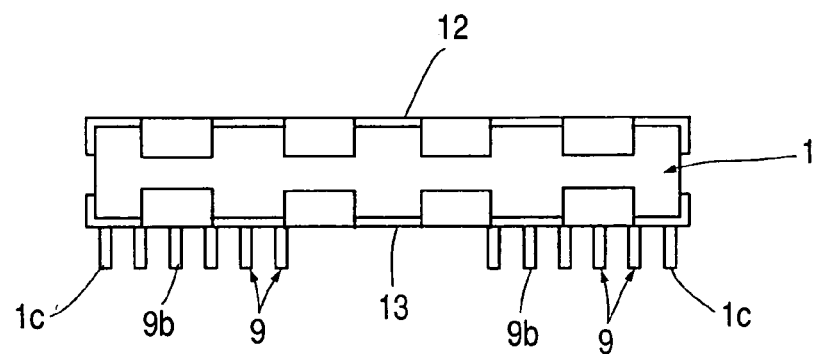
FIG. 1 is a front view showing an electronic circuit unit of the present invention.
Figure 2:
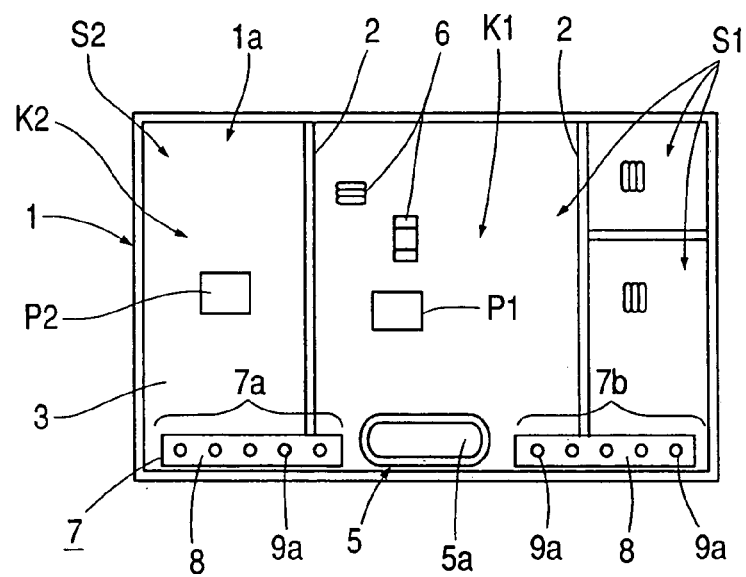
FIG. 2 is a plan view showing the electronic circuit unit of the present invention in a state in which a cover is removed.
Figure 3:
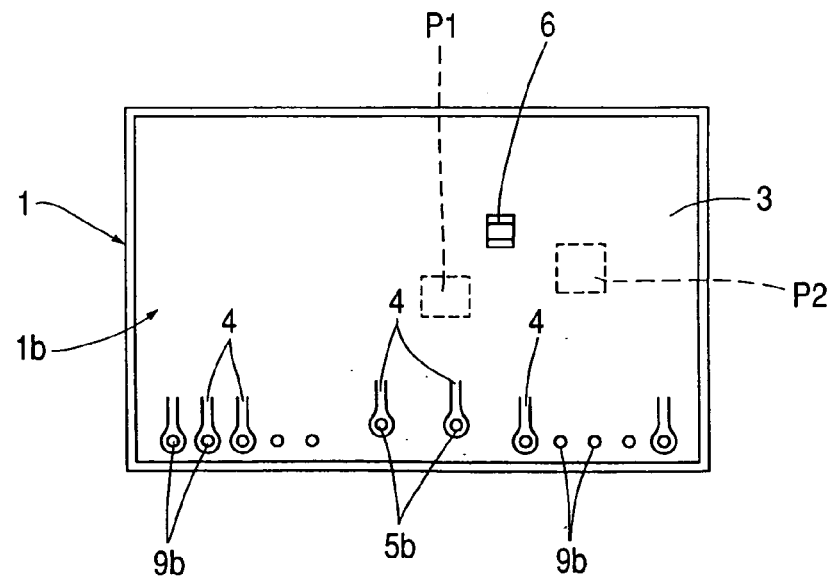
FIG. 3 is a bottom view showing the electronic circuit unit of the present invention in a state in which a cover is removed.

An electronic circuit unit of the present invention will be described with reference to the drawings. FIG. 1 is a front view showing an electronic circuit unit of the present invention. FIG. 2 is a plan view of the electronic circuit unit of the present invention in a state in which a cover is removed. FIG. 3 is a bottom view of the electronic circuit unit of the present invention in a state in which a cover is removed.

Figure 4:
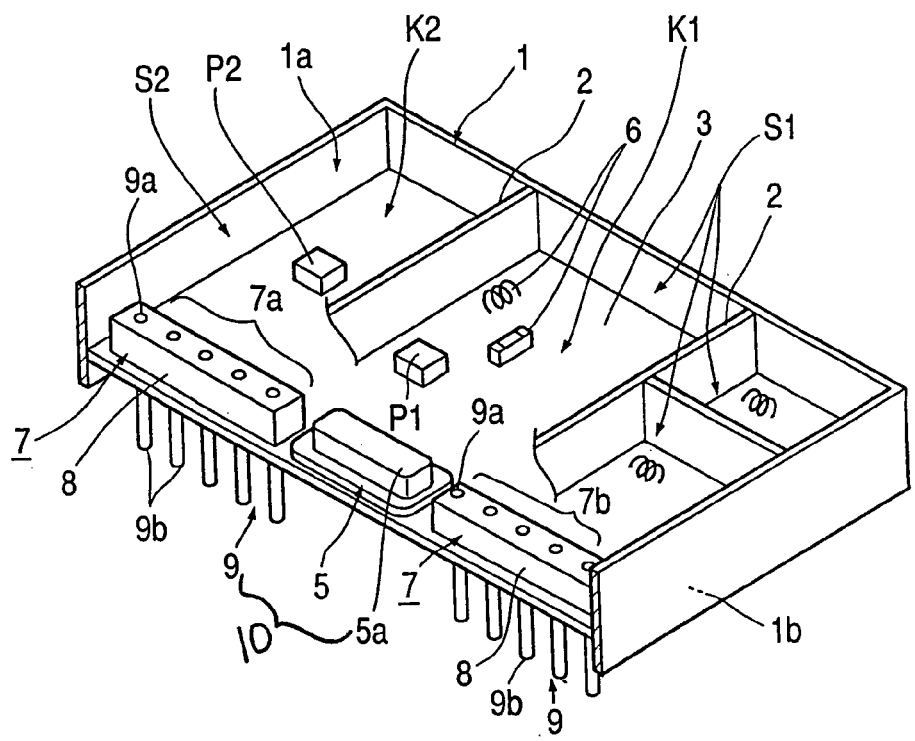
FIG. 4 is a perspective view of the electronic circuit unit of the present invention with the cover removed in which a portion thereof is cut out.
Figure 5:
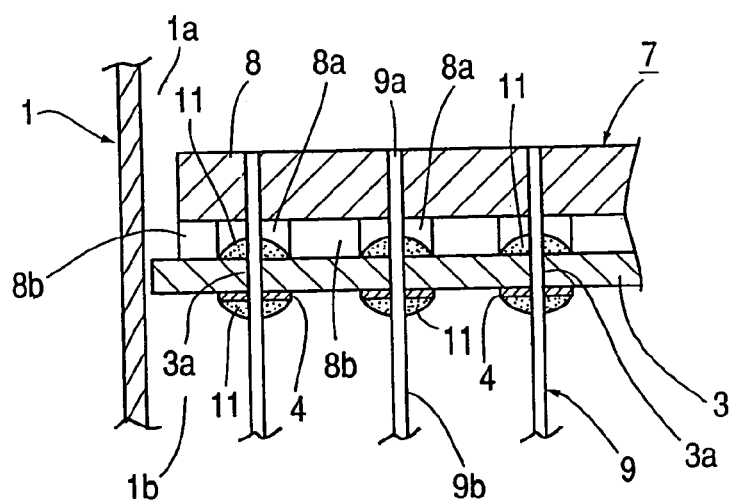
FIG. 5 is an enlarged cross-sectional view of essential parts of the electronic circuit unit of the present invention.
Figure 6:
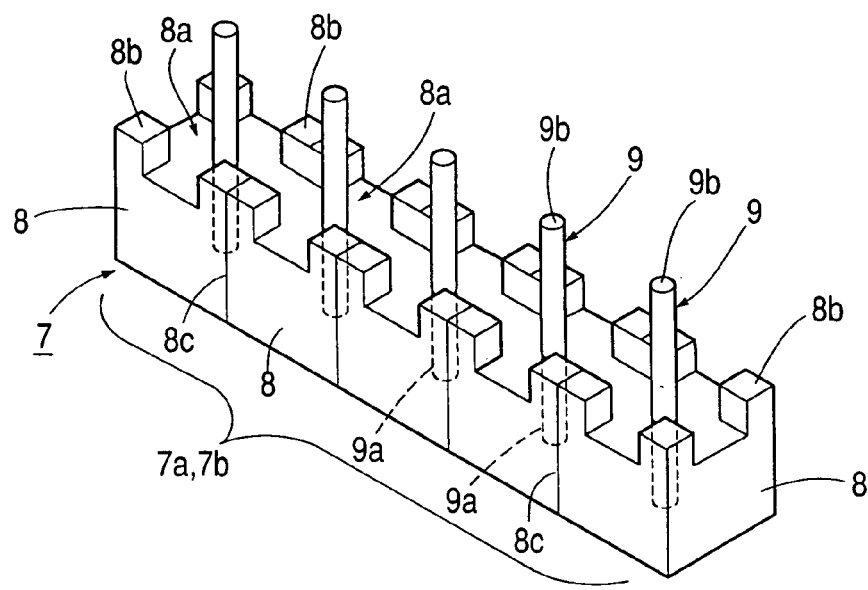
FIG. 6 is a perspective view of the electronic circuit unit of the present invention in a state in which a terminal member is turned over.
Figure 7:
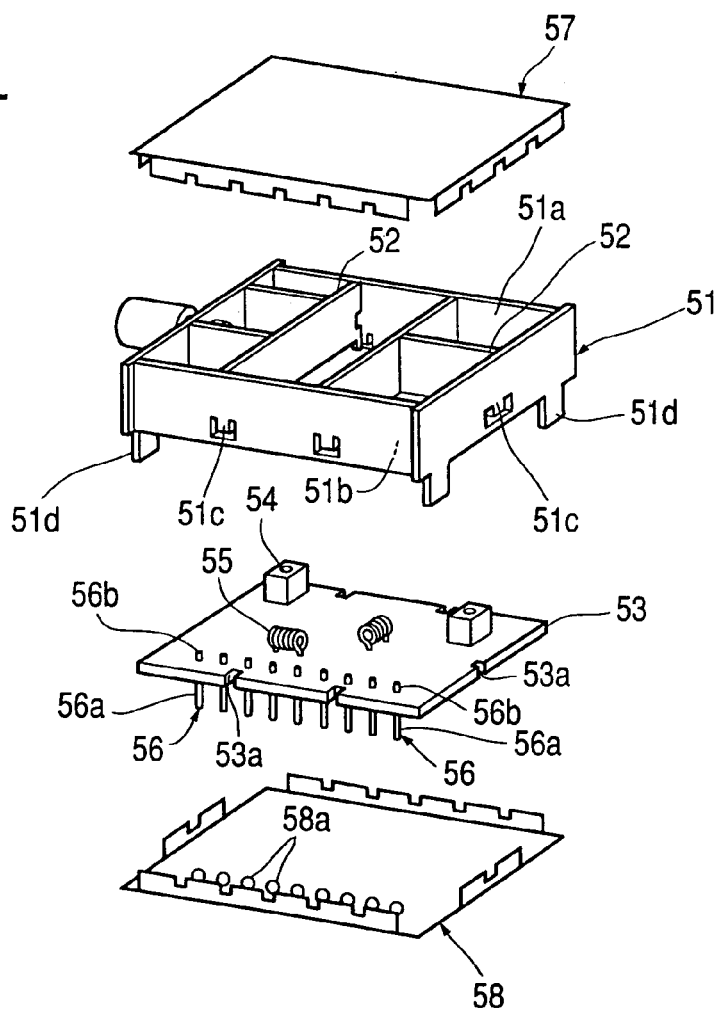
FIG. 7 is an exploded perspective view showing a conventional electronic circuit unit.

Further, FIG. 4 is a perspective view of the electronic circuit unit of the present invention with the cover removed in which a portion thereof is cut out. FIG. 5 is an enlarged cross-sectional view of essential parts of the electronic circuit unit of the present invention. FIG. 6 is a perspective view of the electronic circuit unit of the present invention in a state in which a terminal member is turned over.

Next, the construction of an electronic circuit unit of the present invention will be described with reference to FIGS. 1 to 6. The electronic circuit unit has a box-shaped (a square shape) frame member 1 composed of a metal plate, opened portions 1a and 1b provided in two of its sides, and a plurality of mounting legs 1c projecting downward from the vicinities of four corners.

A shield plate 2 composed of a metal plate is arranged within the frame member 1 to divide the inside of the frame member 1 into a plurality of divided rooms S1 and S2.

On the front and rear surfaces of a rectangular circuit board 3 composed of a ceramic substrate, a conductive pattern 4 for wiring lines is provided, and an electronic component 5 with a metal cover, such as a quartz oscillator, electronic components 6, such as a PLL IC P1, a demodulation IC P2, a coil, and a chip resistor, are mounted on the circuit board 3, thereby forming a desired electric circuit.

That is, a tuner circuit portion K1 for frequency-converting received television signals into intermediate frequency signals and a demodulation circuit portion K2 for detecting the intermediate frequency signals and for outputting video signals and audio signals are provided on the circuit board 3, and the tuner circuit portion K1 and the demodulation circuit portion K2 are respectively arranged in the divided rooms S1 and S2 adjacent to each other with the shield plate 2 interposed therebetween.

Further, the PLL IC P1 is provided in the tuner circuit portion K1, and the demodulation IC P2 is provided in the demodulation circuit portion K2. The electronic component 5 with the cover, which is a quartz oscillator, is connected to the PLL IC P1 and the demodulation IC P2.

Thus, since the electronic component 5 with the cover, which is a quartz oscillator, is housed in the divided room S1 disposed at the side of the tuner circuit portion K1 adjacent to the shield plate 2 provided between the tuner circuit portion K1 and the demodulation circuit portion K2, it is possible to connect the electronic component 5 with the cover to the PLL IC P1 and the demodulation IC P2 at a short distance.

As shown in FIGS. 5 and 6, in particular, terminal members 7 comprises a plurality of supporting members 8 made of an insulating material, such as a ceramic material, and a plurality of terminals 9 each made of a metallic line (a linear shape).

Further, the plurality of supporting members 8 is integrally formed in a line, and one end portion 9a of each of the plurality of terminals 9 is buried at the lower center of each supporting member 8 to be supported. In addition, a terminal portion 9b of the other end thereof projects downward.

Furthermore, the supporting members 8 each have cross-shaped cavity portions 8a provided in the vicinities of the terminals 9, projections 8b projecting downward to form the cavity portions 8a, and slits 8c provided in the outer circumferences between adjacent supporting members 8.

Meanwhile, in the present embodiment, the cavity portions 8a are formed in a cross shape, but may be formed in a circular shape or a rectangular shape.

Further, the terminal members 7 have a plurality of supporting members 8 (in the present embodiment, five supporting members), and a first terminal group 7a and a second terminal group 7b, each comprising a plurality of terminals 9 (in the present embodiment, five terminals) respectively mounted in the supporting members 8.

The first terminal group 7a and the second terminal group 7b are respectively manufactured by burying (mounting) a number of terminals 9 in a line, and by cutting along the slit 8c at a position of the desired number of the supporting members 8 in a state in which a number of supporting members 8 are integrated in a line.

Furthermore, the first terminal group 7a and the second terminal group 7b having such a construction are arranged in the vicinity of one side of the circuit board 3 in a line, and an opening portion 10 is provided between the first terminal group 7a and the second terminal group 7b.

At this time, the projections 8b of the supporting members 8 come in contact with an upper surface of the circuit board 3, and the terminal portions 9b pass through holes 3a of the circuit board 3 to project downward.

Further, when the projections 8b come in contact with the upper surface of the circuit board 3, the cavity portions 8a exist in the vicinities of the terminals 9 disposed at the upper surface of the circuit board 3.

In addition, the terminal portions 9b of the terminals 9 are respectively connected and fixed to the conductive patterns 4 provided in a lower surface of the circuit board 3 by means of solder 11.

Further, as regards a soldering method of the solder 11, first, in a state in which solder cream (not shown) is coated on the conductive patterns 4 of the lower surface of the circuit board 3, the terminals 9 of the first and second terminal groups 7a and 7b are allowed to pass through the holes 3a from the upper surface of the circuit board 3.

Next, the circuit board 3 is conveyed into a reflow furnace as it is, and the soldering of the solder 11 is performed by melting the solder cream. At this time, the melted solder 11 flows out toward the upper surface of the circuit board 3 via the holes 3a by means of a capillary phenomenon.

Here, since the solder 11 that has flowed out on the upper surface of the circuit board 3 is located within the cavity portions 8a, it is possible to prevent the supporting members 8 from being lifted (a floated state) by the solder 11 that has flowed out on the upper surface, thereby precisely mounting the terminal members 7.

Moreover, in the present embodiment, the plurality of supporting members 8 is integrally formed, but a plurality of supporting members 8 may be separately arranged in a line.

Further, the above-mentioned electronic component 5 with the cover has a cover 5a with a flange for covering a main body portion and leads (terminals) 5b projecting downward from the main body portion. As regards the electronic component 5 with the cover, in a state in which the cover 5a is arranged within the opening portion 10 between the first and second terminal groups 7a and 7b, the leads 5b pass through the holes 3a and are connected to the conductive patterns 4 provided in the lower surface of the circuit board 3 by means of solder.

Furthermore, a soldering method of the electronic component 5 with the cover is similar to the soldering method of the terminal members 7 described above, and the soldering of the electronic component 5 with the cover and the terminal members 7 is simultaneously performed after being conveyed into the reflow furnace.

As described above, the electronic component 5 with the cover is arranged in the opening portion 10, such that it is possible to reduce a widthwise dimension of the circuit board 3. Further, since the supporting members 8 of the terminal members 7, which are made of an insulating material, are positioned in the vicinity of the cover 5a, it is possible to more reliably insulate the cover 5a from the terminals 9.

In addition, the circuit board 3 is housed in the frame member 1, and is mounted in the frame member 1 by means of appropriate means.

At this time, in the present embodiment, most terminals of the first terminal group 7a are arranged in the divided room S2 in which the demodulation circuit portion K2 is provided, and all terminals of the second terminal group 7b are arranged in the divided room S1 in which the tuner circuit portion K1 is provided. Further, the electronic component 5 with the cover is housed in the divided room S1 in which the tuner circuit portion K1 is provided at a position between the first and second terminal groups 7a and 7b.

The first cover (the upper cover) 12 and the second cover (the lower cover) 13 that are composed of a metal plate are respectively mounted in the frame member 1 while covering the opened portions 1a and 1b of the frame member 1.

At this time, the terminal portions 9b of the terminals 9 project downward from the holes of the second cover 13, which are not shown in the drawings.

As described above, the electronic circuit unit of the present invention comprises a box-shaped frame member composed of a metal plate, a circuit board mounted in the frame member, an electronic component with a cover mounted on the circuit board, and a plurality of linear terminals mounted in the circuit board while passing through the circuit board, wherein the terminals comprise at least a first terminal group and a second terminal group arranged at an interval between the respective terminals in a line, the first terminal group and the second terminal group being arranged in the vicinity of one side of the circuit board, wherein an opening portion is provided between the first terminal group and the second terminal group, and wherein the electronic component with the cover is mounted on the circuit board while being disposed in the opening portion. As a result, a good space factor for the arrangement of the electronic component with the cover can be obtained, such that it is possible to reduce a widthwise direction dimension of the circuit board, thereby obtaining a small-sized electronic circuit unit.

Further, according to the present invention, since the electronic component with the cover comprises the quartz oscillator, the electronic circuit unit of the present invention is suitable for, in particular, a television tuner device.

Furthermore, according to the present invention, the electronic circuit unit further comprises supporting members made of an insulating material, one end of each of the respective terminals is supported by the supporting member, and the supporting members and the electronic component with the cover are arranged on the same surface of the circuit board. Therefore, it is possible to more reliably insulate the electronic component with the cover from the terminals.

Moreover, according to the present invention, since the supporting members are integrally formed with the first terminal group and the second terminal group, respectively, it is easier to mount the terminals on the circuit board, and thus it is possible to obtain an electronic circuit unit having a good manufacturing productivity.

According to the present invention, the inside of the frame member is divided into a plurality of divided rooms by means of a shield plate, and a tuner circuit portion for frequency-converting received television signals into intermediate frequency signals and a demodulation circuit portion for detecting the intermediate frequency signals and for outputting video signals and audio signals are respectively arranged in the divided rooms adjacent to each other with the shield plate interposed therebetween. In addition, a phase locked loop (PLL) IC provided in the tuner circuit portion and a demodulation IC provided in the demodulation circuit portion are connected to the quartz oscillator. As a result, it is possible to use one quartz oscillator to both the tuner circuit portion and the demodulation circuit portion, thereby obtaining a compact electronic circuit unit.

According to the present invention, since the quartz oscillator is housed in the divided room disposed at the side of the tuner circuit portion adjacent to the shield plate provided between the tuner circuit portion and the demodulation circuit portion, it is possible to connect the quartz oscillator to the PLL IC and the demodulation IC at a short distance.

What is claimed is:

1. An electronic circuit unit comprising:
   a box-shaped frame member composed of a metal plate;
   a circuit board mounted in the frame member;
   an electronic component with a cover mounted on the circuit board; and
   a plurality of linear terminals that passes through and is mounted in the circuit board,
   wherein the terminals comprise at least a first terminal group and a second terminal group arranged at an interval between the respective terminals in a line, the first terminal group and the second terminal group being arranged in the vicinity of one side of the circuit board,
   wherein an opening portion is provided between the first terminal group and the second terminal group, and
   wherein the electronic component with the cover is mounted on the circuit board while being disposed in the opening portion.

2. The electronic circuit unit according to claim 1, wherein the electronic component with the cover comprises a quartz oscillator.

3. The electronic circuit unit according to claim 2, further comprising supporting members made of an insulating material,
  wherein one end of each of the terminals is supported by the supporting member, and the supporting members and the electronic component with the cover are arranged on the same surface of the circuit board.

4. The electronic circuit unit according to claim 3,
  wherein the supporting members are integrally formed with the first terminal group and the second terminal group, respectively.

5. The electronic circuit unit according to claim 2,
  wherein the inside of the frame member is divided into a plurality of divided rooms by means of a shield plate,
  wherein a tuner circuit portion for frequency-converting received television signals into intermediate frequency signals and a demodulation circuit portion for detecting the intermediate frequency signals and for outputting video signals and audio signals are respectively arranged in the divided rooms adjacent to each other with the shield plate interposed therebetween, and
  wherein a phase locked loop (PLL) IC provided in the tuner circuit portion and a demodulation IC provided in the demodulation circuit portion are connected to the quartz oscillator.

6. The electronic circuit unit according to claim 5,
  wherein the quartz oscillator is housed in the divided room disposed at the side of the tuner circuit portion adjacent to the shield plate provided between the tuner circuit portion and the demodulation circuit portion.

* * * * *